United States Patent [19]
Gallavan

[11] Patent Number: 5,998,985
[45] Date of Patent: Dec. 7, 1999

[54] VOLTAGE INDICATOR USING SERIAL COMPARISON VOLTAGE MEASUREMENT

[75] Inventor: Michael F. Gallavan, Edmonds, Wash.

[73] Assignee: Fluke Corporation, Everett, Wash.

[21] Appl. No.: 09/026,934

[22] Filed: Feb. 20, 1998

[51] Int. Cl.$^6$ ................................................ G01R 19/155
[52] U.S. Cl. ........................ 324/133; 340/510; 340/511
[58] Field of Search .................................. 324/133, 122; 340/510, 511

[56] References Cited

U.S. PATENT DOCUMENTS

| | | | |
|---|---|---|---|
| 4,634,971 | 1/1987 | Johnson et al. | 324/133 |
| 4,713,607 | 12/1987 | Pepper | 324/126 |
| 5,233,329 | 8/1993 | Lippmann et al. | 340/511 |
| 5,336,944 | 8/1994 | Fischer | 324/133 |
| 5,710,503 | 1/1998 | Sideris et al. | 324/426 |

*Primary Examiner*—Josie Ballato
*Assistant Examiner*—Khaled Brown
*Attorney, Agent, or Firm*—George T. Noe

[57] ABSTRACT

A voltage indicator using a serial or sequential comparison voltage measurement technique. Reference voltages generated by a voltage divider are applied to inputs of a multiplexer which is driven by a counter to select one reference voltage at a time in sequence to be presented via an output terminal to one input of a voltage comparator. An input signal to be measured is applied the other input of the comparator. When the input signal matches or exceeds the reference voltage at the output terminal of the multiplexer, the comparator switches, providing an enable signal to a one-of-N decoder. The one-of-N decoder is also driven by the counter, so that outputs of the decoder and corresponding inputs of the multiplexer are addressed simultaneously. The outputs of the one-of-N decoder are connected to LEDs which indicate the voltage level or magnitude. The voltage input signal may be applied via a conditioning amplifier that scales the input signal and an absolute value amplifier which provides an output in one polarity for comparison purposes. DC voltage polarity is detected and may be indicated by separate LEDs. Additionally, an AC/DC decode logic circuit may be provided to discern between AC and DC input voltages, and provide appropriate indication. While the preferred embodiment contemplates that both nominal AC and DC reference voltages may be provided by the same voltage divider, a gain control signal may be provided to change the gain of the absolute value amplifier by a ratio of √2 so that the same reference values may be used for both AC and DC measurements.

4 Claims, 2 Drawing Sheets

VOLTAGE INDICATOR USING SERIAL COMPARISON VOLTAGE MEASUREMENT

BACKGROUND OF THE INVENTION

This invention relates generally to voltage measuring and indicating devices, and in particular to a voltage indicator using serial comparison voltage measurement.

In the past it has been popular to employ a parallel string of comparators, each connected to a different reference voltage for comparison with an input voltage signal, for providing voltage measurements. The parallel comparator technique has been employed in analog-to-BCD converters, analog-to-Gray Scale converters, and analog bar graph voltage indicators.

Such a prior art parallel comparator circuit is shown in FIG. 1. A voltage input signal $V_{IN}$ is applied via an input terminal 10 simultaneously to the inverting (−) inputs of comparators 12-1, 12-2, 12-3, and 12-4. The non-inverting (+) inputs of comparators 12-1 through 12-4 are connected to reference voltages $V_1$, $V_2$, $V_3$, and $V_4$, respectively, which are provided in an increasingly positive direction in this example by a voltage divider string comprising resistors 14-1, 14-2, 14-3, 14-4, and 14-5 connected in series between a reference voltage supply $V_{REF}$ and ground. The outputs of comparators 12-1 through 12-4 are coupled in this example to the cathodes of light-emitting diodes (LEDs) 16-1 through 16-4, respectively, the anodes of which in turn are coupled to a voltage source $V_{CC}$ through respective load resistors 18-1 through 18-4.

When the voltage applied to the − input of any of the comparators 12-1 through 12-4 exceeds the reference voltage applied to the + input, the output of the comparator switches to a low state, turning on the LED in its output circuit. For example, suppose the voltage input signal $V_{IN}$ applied to the − input of comparator 12-1 exceeds the value of $V_1$ applied to the + input thereof. The output of comparator 12-1 switches to a low state, turning on LED 16-1. Continuing with this example, suppose the voltage input signal $V_{IN}$ rises to a value between $V_3$ and $V_4$. Comparators 12-2 and 12-3 switch, turning on LEDs 16-2 and 16-3. So now LEDs 16-1, 16-2, and 16-3 are conducting and emitting light, providing an indication that the voltage input signal has a value greater than $V_3$ but less than $V_4$.

A major drawback to the parallel comparator technique is the large numbers of comparators that are required to produce the desired result. Associated with the large number comparators are offset and drift problems within the comparators themselves, and attendant power consumption.

It would be desirable to provide a comparison method having the same result as the parallel comparator technique, but without the attendant problems associated with large numbers of comparators which take up room, consume large amounts of power, and exhibit offset and drift that need to be corrected separately.

One way to reduce the number of comparators is to employ an absolute-value amplifier as input circuit, which would permit the use of a single-polarity voltage in determining the output magnitude. However, offset and drift problems associated with such absolute-value amplifiers creates an ambiguity in the level of the output magnitude.

SUMMARY OF THE INVENTION

In accordance with the present invention, the foregoing problems are overcome by a voltage indicator using a serial comparison voltage measurement technique. Reference voltages generated by a voltage divider are applied to inputs of a multiplexer which is driven by a counter to select one reference voltage at a time to be presented via an output terminal to one input of a voltage comparator. An input signal to be measured is applied the other input of the comparator. When the input signal matches or exceeds the reference voltage at the output terminal of the multiplexer, the comparator switches, providing an enable signal to a one-of-N decoder. The one-of-N decoder is also driven by the counter, so that outputs of the decoder and corresponding inputs of the multiplexer are addressed simultaneously. The outputs of the one-of-N decoder are connected to LEDs which indicate the voltage level or magnitude.

To eliminate flicker of the LEDs, the multiplexer and one-of-N decoder may include latches for holding the comparison value until the next reading. In a proposed commercial embodiment, the counter which drives the multiplexer and decoder is driven by an 8-kilohertz clock to provide 16 addresses per reading cycle. These addresses include decoding seven nominal DC voltages, seven nominal AC voltages, and provided two auto-zero steps (for zeroing out differential amplifier offset and drift) per reading cycle.

The voltage input signal may be applied via a conditioning amplifier that scales the input signal for either AC or DC, and provides for absolute value of signal magnitude so that comparison of DC voltages with selected reference voltages may be made in one polarity. This eliminates the need for additional power supplies and components. DC voltage polarity, whether positive or negative, may be indicated to a user by separate LEDs. Additionally, an AC/DC decode logic circuit may be provided to discern between AC and DC input voltages, and provide appropriate indication.

Reference voltages for both AC and DC indication may be provided by same reference divider, using a factor $V\sqrt{2}$ to provide the references for AC indication. Alternatively, a gain control signal may be provided to change the gain of the signal conditioning amplifier so that the same measurement values may be used for both AC and DC measurements.

The signal conditioning amplifier is an absolute-value amplifier with an auto-zero loop for zeroing the effects of offset and drift, so that the comparator accurately compares the input magnitude with predetermined comparison levels.

It is therefore one object of the present invention to provide a voltage indicator using a serial comparison voltage measurement technique.

It is another object of the present invention to provide a voltage measurement and indicator circuit in which a single comparator is utilized.

It is yet another object of the present invention to provide a voltage indicator and measurement circuit in which an absolute-value amplifier used as an input circuit incorporates an automatic zeroing loop to eliminate the effects of offset and drift.

It is a further object of the present invention to reduce power consumption and complexity in a voltage measurement and indicating system.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
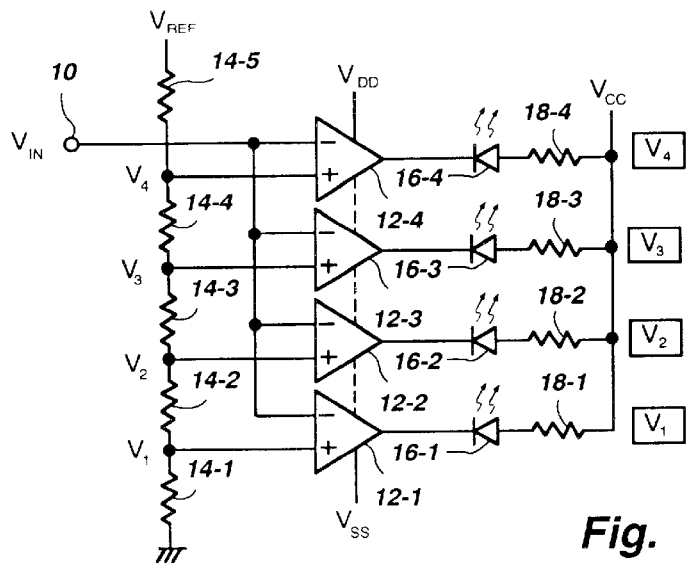
FIG. 1 is a schematic diagram of a prior art parallel comparator circuit to provide voltage indication.
Figure 2:
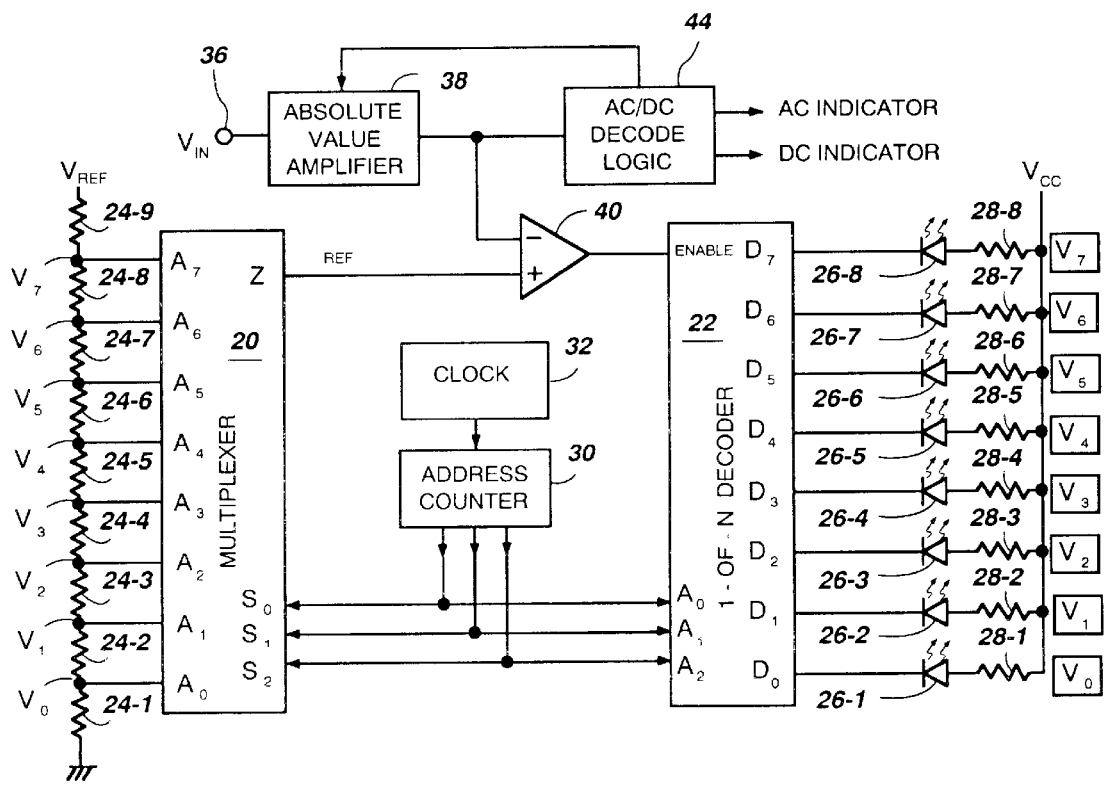
FIG. 2 is a schematic diagram of a voltage indicator using serial comparison voltage measurement in accordance with the present invention.

Referring to FIG. 2 of the drawings, which is a schematic diagram of a voltage indicator using serial comparison voltage measurement in accordance with the present invention, there is shown a multiplexer 20 having inputs $A_0$–$A_7$ and a one-of-N decoder 22 having corresponding outputs $D_{0-D7}$. Multiplexer 20 may suitably be a commercially available 74HC4051 and on-of-N decoder 22 may suitably be a commercially available 74HC138.

A voltage divider string of resistors 24-1 through 24-9 is connected in series between $V_{REF}$ and ground to generate a series of reference voltages $V_0$ through $V_7$ in accordance with the voltage drops across the resistors. The reference voltages $V_0$ through $V_7$ are applied to inputs $A_0$ through $A_7$, respectively, of multiplexer 20.

The outputs D0 through D7 of one-in-N decoder 22 are connected to the cathodes of LEDs 26-1 through 26-8, respectively. The anodes of LEDs 26-1 through 26-8 are connected to a voltage source $V_{CC}$ through load resistors 28-1 through 28-8, respectively.

An address counter 30, driven by a clock 32, simultaneously addresses multiplexer 20 and one-of-N decoder 22 by applying count signals to inputs $S_0$, $S_1$, and $S_2$ of multiplexer 20 and to inputs $A_0$, $A_1$, and $A_2$ of one-of-N decoder 22. The effect of this operation is to simultaneously select an input $A_0$ through $A_7$ of multiplexer 20 and a corresponding output $D_0$ through $D_7$ of one-of-N decoder 22.

A voltage input signal $V_{IN}$ is applied via an input terminal 36 and an absolute value amplifier 38 to the inverting input of a comparator 40, wherein $V_{IN}$ is compared with one of reference voltages $V_0$ through $V_7$ as selected by address counter 30 and steered to output pin Z of multiplexer 20 connected to the non-inverting input of comparator 40. The output of comparator 40 is connected to the ENABLE input of one-of-N decoder 22, and when the voltage input signal $V_{IN}$ exceeds the voltage selected by multiplexer 20, comparator 40 switches, generating an enable signal. When an enable signal is applied to the ENABLE input of one-of-N decoder 22, the single output $D_0$ through $D_7$ selected by address generator 30 goes low, turning on the corresponding LED 26-1 through 26-8.

As can be discerned, comparator 40 operates to enable the one-of-N decoder 22 when the input signal matches a reference voltage $V_0$ through $V_7$. Address counter 30 free runs at the rate provided by clock 32, sequentially selecting corresponding $A_0$–$A_7$ inputs of multiplexer 20 and $D_0$–$D_7$ outputs of one-of-N decoder 22. To provide a thorough understanding of this operation, consider the following example. Let us suppose the voltage input signal $V_{IN}$ has a value between $V_4$ and $V_5$. When address counter selects inputs $A_0$, $A_1$, $A_2$, $A_3$, and $A_4$ of multiplexer 20 in sequence and steers voltages $V_0$, $V_1$, $V_2$, $V_3$, and $V_4$ sequentially to output pin Z, the comparator 40 switches and remains low because these voltages are smaller in magnitude than the value of VIN. At the same time, address counter 30 selects outputs $D_0$, $D_1$, $D_2$, $D_3$, and $D_4$ in sequence, causing LEDs 26-1, 26-2, 26-3, and 26-4 to light in sequence, providing an indication of the magnitude of the voltage input signal $V_{IN}$.

When address counter selects inputs $A_5$ through $A_7$ in sequence, in this example, comparator 40 does not switch because reference voltages $V_5$ through $V_7$ are greater in magnitude than the value of voltage input signal $V_{IN}$. Thus the one-of-N decoder 22 is not enabled when address counter 30 selects outputs $D_5$ through $D_7$ in our example.

The clock frequency of clock 32 should be chosen to provide a non-flickering display. In a proposed commercial embodiment, the clock frequency is 8 kilohertz and address counter 30 has a 16-count output. Reference voltage divider 24 provides seven nominal DC reference voltages and seven nominal AC reference voltages, each of which is $\sqrt{2}$ times the corresponding DC reference voltage. This allows both DC and AC indications of the same nominal value to be provided by the same LED. The remaining two counts are for auto-zeroing of the absolute value amplifier and comparator, as will be discussed hereinbelow. Moreover, the multiplexer and one-of-N decoder may suitably include latched address decoders to allow a comparison to be made during a 16-count reading cycle, latching the reference voltage and lighting the appropriate LED. That is, by using address decoders and latches, the appropriate LED remains turned on until a next reading is taken.

For DC signals, absolute value amplifier 38 may suitably have unity gain, that is, a gain of one. Thus a unit of change in either positive or negative polarity results in a positive-going unit of change at the output for DC signals. A polarity detector (not shown) may be provided to detect the polarity and provide a visual indication of the polarity. Absolute value amplifier 38 eliminates the necessity to provide both positive and negative voltages for comparison, reducing complexity of the serial comparison measurement circuit. For AC signals, absolute value amplifier 38 is effectively a full-wave rectifier, providing a pulsating DC output. In this regard, the output latches and LED drivers can be arranged to provide a relative indication of AC voltages wherein lower AC voltages and their corresponding LEDs are latched on for a longer period of time than AC voltages of greater magnitude (because of the half-sinusoidal shape of the pulses), resulting in a series of LEDs that grow dimmer in the direction of increasing magnitude, and eventually go out when the peak is detected.

An AC/DC decode logic circuit 44 may be provided to detect whether the voltage input signal $V_{IN}$ is an AC signal or a DC signal. Moreover, since an AC signal is $\sqrt{2}$ times the value indicated, a gain-control signal may be applied to set the gain of amplifier 38 accordingly. This alternative would eliminate the need to provide different reference or supply voltages for AC and DC operation, but may result in greater amplifier complexity. An indication of AC or DC may also be provided. For example, separate LEDs to indicate AC or DC may be connected to the AC/DC decode logic circuit.

Figure 3:
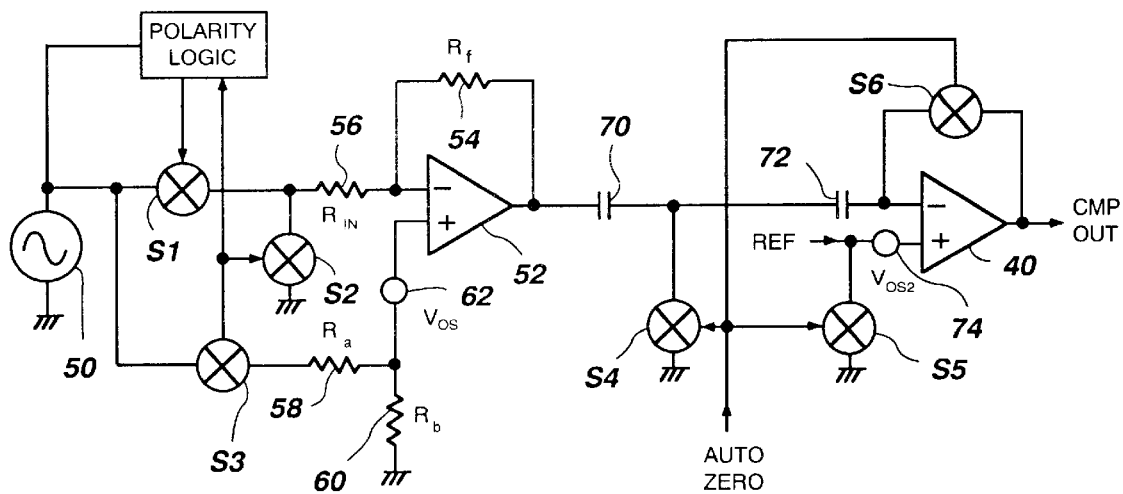
FIG. 3 is a schematic diagram of an absolute-value amplifier and comparator with automatic offset and drift voltage zeroing as used in the present invention.

In a proposed commercial embodiment, absolute value amplifier 38 is optimized to have the same noise gain for both polarities of input signal. As will be seen, this is important in being able to cancel offset and drift irrespective of the signal polarity. Offset and drift errors associated with absolute value amplifier 38 and comparator 40 are eliminated by being zeroed out on each complete cycle of address counter 30. Refer to the mathematical model shown in FIG. 3 for this discussion.

An input voltage source, which may suitably provide negative or positive DC voltages or an AC voltage, is represented by a voltage generator 50, which is connected to the inputs of absolute value amplifier 38 through a network of switches S1, S2, and S3.

Absolute value amplifier 38 comprises an operational amplifier 52 having a feedback resistor 54 which has a value of $R_f$ connected from its inverting (−) input to its output. An input resistor 56, which has a value of $R_{in}$, is connected from the junction of switches S1 and S2 to the inverting input of operational amplifier 52. On the non-inverting (+) input side of operational amplifier 52, input resistors 58 and 60, having values of $R_a$ and $R_b$, respectively, are connected in series between switch S3 and ground to form a voltage divider, and the junction of resistors 58 and 60 is connected to the non-inverting input of operational amplifier 52. A small voltage generator 62 is shown inserted into the circuit path between the junction of resistors 58 and 60 and the non-inverting input. Small voltage generator 62 represents the offset voltage $V_{OS}$ (on the order of a few millivolts) that is intrinsic to the operational amplifier system. For this discussion, assume that switches S1, S2, and S3 have negligible resistance, and $R_f=R_{in}=R_a=R_b$.

A polarity logic circuit 64 receives the input voltage and applies turn-on, turn-off signals to switches S1, S2, and S3 in accordance with the polarity of the input voltage. When the input voltage is negative, switch S1 is on while switches S2 and S3 are off. Likewise, when the input voltage is positive, switches S2 and S3 are on while switch S1 is off.

With both inputs of operational amplifier 52 grounded, the noise gain of the system is given by $$A_{NOISE}=1+R_f/R_{in}. \quad (1)$$

Where, as is the case here, $R_f=R_{in}$, the noise gain $A_{NOISE}=2$.

When the input voltage from voltage generator 50 is negative, switch S1 is on and the negative input voltage is applied to resistor 56. The voltage gain for a negative-going input voltage is given by $$A_{(-)}=-R_f/R_{in}. \quad (2)$$

Because the resistors are equal in value, as discussed above, the gain is −1, or unity.

When the input voltage from voltage generator 50 is positive, switches 2 and 3 are on and the positive input voltage is applied to resistor 58. The voltage gain for a positive input voltage is given by $$A_{(+)}=[R_b/(R_a+R_b)][1+R_f/R_{in}]. \quad (3)$$

Again, because the resistors are equal in value, the gain is +1, or unity.

If switches S1 through S3 have appreciable resistance in the on condition, such as may be exhibited by some field-effect transistors, then of course the switch resistance will have to be taken into account in the foregoing gain equations.

Thus, it can be seen that for either a negative or a positive polarity of input signal, the output of absolute value amplifier 38 is a positive-going voltage equal in magnitude to magnitude of the input. The output of absolute value amplifier 38 is applied via serially-connected capacitors 70 and 72, the purpose of which will be seen shortly, to one input of comparator 40. Note that a small voltage generator 74 has been inserted into the circuit at the non-inverting input of comparator 40 to represent offset voltage $V_{OS2}$ inherent to the comparator.

In an autozero cycle, such as may be provided at the beginning of the count cycle of address counter 30, switches S4, S5, and S6 are closed, connecting ground to the junction of capacitors 70 and 72, as well as grounding the non-inverting input of comparator 40, and connecting the output of comparator 40 its inverting input. At the same time, the inputs of absolute value amplifier 38 are grounded. The output of operational amplifier 52, which is $2V_{OS}$ with the inputs grounded, is stored on capacitor 70. The comparator offset voltage $V_{OS2}$ is stored on capacitor 72. When the autozero cycle ends, switches S4, S5, and S6 are opened, and while the offset voltages stored on capacitors 70 and 72 are algebraically added together, the net effect is to subtract these offsets from the circuit.

Switches S1 through S6 may be implemented using any of a number of known electronic switches, such as silicon or CMOS transistors or field-effect transistors.

The proposed commercial embodiment of the present invention is a voltage indicator which provides indication of a number of predetermined positive or negative DC or AC voltages, rather than resolving voltage measurements to precise values. The output of the absolute value amplifier 38 for AC signals has a ripple frequency of twice input frequency because of the effective full-wave rectification. Ordinarily, this ripple voltage would require filtering for the comparator to trip at the same threshold for both DC and AC voltages. However, the sequential design shown and described herein eliminates the need for filtering, and thereby slowing the response time. Instead, reference voltages made be provided by voltage divider 24 which are √2 times the indicated voltage. For example, suppose the indicated voltage is 24 volts. Voltage divider 24 would provide 24 volts to multiplexer 20 for 24 volts DC. For 24 volts AC, however, voltage divider 24 would provide 33.94 volts (which is 24√2) for comparison by comparator 40. Thus, for indicated DC and AC voltages, the appropriate reference voltages for comparison may easily be designed into the voltage divider 24, and are selected sequentially by the address counter 30. Moreover, if the input signal is attenuated, the reference voltages may be scaled accordingly. For example, for 1000:1 attenuation of the input signal or voltage being measured, the output of the absolute value amplifier for 24 volts DC in our example would be 24 millivolts. Then the reference voltages for indicated 24 volts DC and AC would be 24 millivolts and 33.94 millivolts, respectively. These low levels of comparison voltages facilitate operation by battery power in a hand-held voltage indicator.

Figure 4:
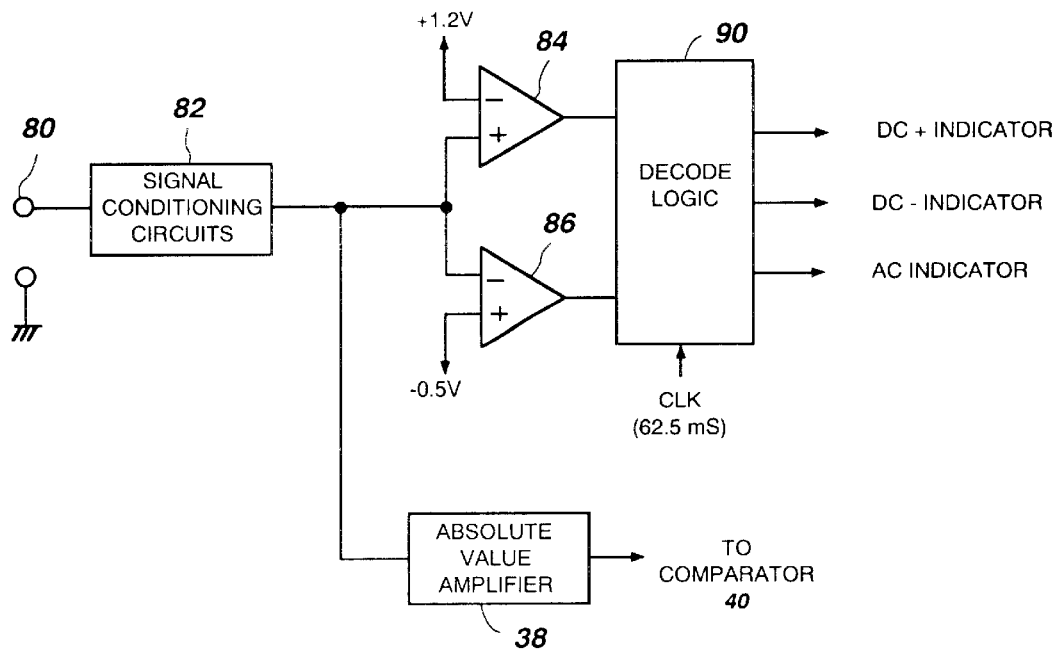
FIG. 4 is a schematic diagram of an AC/DC detection and decode logic circuit.

The AC/DC detection and decode logic circuit for the proposed commercial embodiment is shown in FIG. 4. Unknown input voltages or signals are applied via an input terminal 80 to a signal conditioning circuit 82, which includes appropriate attenuators or dividers to scale the input voltage, transient filters to remove voltage spikes, and protection circuits to prevent damage from overvoltage to the following circuitry. The output of signal conditioning circuit 82 is applied to absolute value amplifier 38 as described hereinabove, and to a pair of comparators 84 and 86, which perform a window comparison function to determine the status of the input signal or voltage. The outputs of comparators 84 and 86 are applied to a decode logic circuit 90. Also applied to decode logic circuit 90 is a clock signal (CLK), which in the proposed commercial embodiment has a period of 62.5 milliseconds. If both comparators 84 and 86 trip twice during a clock period, the input signal is determined to be an AC signal. If comparator 84 trips and remains steady after a clock period, the input is determined to be DC+. If comparator 86 trips and remains steady after a clock period, the input is determined to be DC−. The outputs from decode logic circuit 90, therefore, are DC+, DC−, and AC, and these outputs are applied to the appropriate indicators.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. A voltage indicating circuit, comprising:

an input terminal for receiving an input voltage;

a multiplexer having a plurality of reference voltages applied to inputs thereof;

a one-of-N decoder having a plurality of indicator devices coupled to outputs thereof;

a control circuit for causing said multiplexer and said one-of-N decoder to operate in a sequence such that corresponding inputs of said multiplexer and outputs of said one-of-N decoder are simultaneously activated in pairs; and a comparator coupled to said input terminal and to an output of said multiplexer for comparing said input voltage with said plurality of reference voltages and enabling said one-of-N decoder when said input voltage is at least in as great a magnitude as a reference voltage thereby to activate said plurality of indicator devices corresponding to said plurality of reference voltages.

2. A voltage measuring circuit in accordance with claim 1 further comprising an absolute value amplifier disposed between said input terminal and said comparator.

3. A voltage measuring circuit in accordance with claim 2 further comprising a polarity detector to determine the polarity of the input voltage and at least one polarity indicator to indicate the polarity detected.

4. A voltage measuring circuit in accordance with claim 1 further comprising an AC/DC decode logic circuit for discerning whether said input voltage is AC or DC, and providing appropriate AC or DC indication.

* * * * *